United States Patent [19]

Hinchliffe

[11] Patent Number: 5,821,548
[45] Date of Patent: Oct. 13, 1998

[54] BEAM SOURCE FOR PRODUCTION OF RADICALS AND METASTABLES

[75] Inventor: Robert D. Hinchliffe, Newberg, Oreg.

[73] Assignee: Technical Visions, Inc., Beaverton, Oreg.

[21] Appl. No.: 772,115

[22] Filed: Dec. 20, 1996

[51] Int. Cl.$^6$ .................................................. H01J 49/00
[52] U.S. Cl. ............................... 250/492.21; 250/492.2; 250/423 R; 315/111.81
[58] Field of Search ......................... 250/492.21, 492.2, 250/492.1, 423 R, 424, 426; 315/111.21, 111.51, 111.81, 111.71

[56] References Cited

U.S. PATENT DOCUMENTS

| | | | |
|---|---|---|---|
| 4,339,782 | 7/1982 | Yu et al. | 361/229 |
| 4,414,488 | 11/1983 | Hoffmann et al. | 315/39 |
| 4,668,538 | 5/1987 | Feichtner et al. | 427/248 |
| 4,675,493 | 6/1987 | Gartland et al. | 219/74 |
| 4,726,320 | 2/1988 | Ichikawa | 118/722 |
| 4,734,158 | 3/1988 | Gillis | 156/643 |
| 4,755,344 | 7/1988 | Friedman et al. | 376/108 |
| 4,894,511 | 1/1990 | Caledonia et al. | 219/121.52 |
| 4,983,253 | 1/1991 | Wolfe et al. | 156/643 |
| 5,054,421 | 10/1991 | Ito et al. | 118/723 |
| 5,085,885 | 2/1992 | Foley et al. | 477/38 |
| 5,108,535 | 4/1992 | Ono et al. | 156/345 |
| 5,115,135 | 5/1992 | Oomori et al. | 250/423 P |
| 5,221,643 | 6/1993 | Griep | 437/233 |
| 5,224,501 | 7/1993 | Nakayama et al. | 118/725 |
| 5,227,363 | 7/1993 | Furukawa et al. | 505/1 |
| 5,244,501 | 9/1993 | Nakayama et al. | 118/725 |
| 5,248,631 | 9/1993 | Park et al. | 437/105 |
| 5,275,687 | 1/1994 | Choquette et al. | 156/612 |
| 5,310,697 | 5/1994 | Kan et al. | 437/129 |
| 5,345,079 | 9/1994 | French et al. | 250/288 |
| 5,356,672 | 10/1994 | Schmitt, III et al. | 427/446 |
| 5,356,673 | 10/1994 | Schmitt, III et al. | 427/446 |
| 5,358,596 | 10/1994 | Cappelli et al. | 117/99 |
| 5,401,974 | 3/1995 | Oae et al. | 250/492.2 |
| 5,424,103 | 6/1995 | Ahn | 427/569 |
| 5,478,400 | 12/1995 | Shimizu | 118/733 |

OTHER PUBLICATIONS

Droege, A.T. and Engelking, P.C., *Supersonic Expansion Cooling of Electronically Excited OH Radicals*, Chemical Physics Letters, 96(3), Apr. 8, 1983, pp. 316–218.

Engelking, P.C., *Corona Excited Supersonic Expansion*, Rev. Sci. Instrum. 57(9), Sep. 1986, pp. 2274–2277.

Kubota, K.; Kobayashi, Y.; Fujimoto, K., *Preparation and Properties of III–V Nitride Thin Films*, J. Appl. Phys., 66(7), Oct. 1989, pp. 2984–2988.

J. Asmussen, R. and Mahoney, L., *ECR ion and free radical for MBE applications*, Rev. Sci. Instrum., 61(1), Jan. 1990, pp. 282–284.

(List continued on next page.)

*Primary Examiner*—Kiet T. Nguyen
*Attorney, Agent, or Firm*—Klarquist Sparkman Campbell Leigh & Whinston, LLP

[57] ABSTRACT

Methods and apparatus for fabricating semiconductors by producing a corona discharge plasma comprising an intense beam of high-energy particles, supersonically expanding the plasma, and defining and directing the plasma toward a substrate, are disclosed. A discharge system including a corona discharge nozzle, a source body, a molecular beam skimmer, and a thin-film vacuum deposition chamber is used to deposit or modify a thin film on a substrate. A gas to be activated is supplied to the corona discharge nozzle at a relatively high pressure in comparison to the pressure inside the source body. A corona discharge is generated within an orifice of the nozzle. Energy from the discharge is transferred to the gas particles creating a corona discharge plasma of high-energy particles. As the plasma exits the nozzle orifice, the plasma is supersonically expanded inside the source body. A molecular beam skimmer defines and directs the plasma toward a substrate within a thin-film vacuum deposition chamber.

20 Claims, 2 Drawing Sheets

OTHER PUBLICATIONS

Sitar, Z.; Paisley, M.J.; Smith, D.K.; Davis, R.F., *Design and Performance of an Electron Cyclotron Resonance Plasma Source for Standard Molecular Beam Epitaxy Equipment*, Rev. Sci. Instrum. 61(9), Sep. 1990, pp. 2407–2411.

O'Keeffe, Patrick, Komuro, Shuji, Den, Shoji, Morikawa, Takitaro, and Aoyagi Yoshinobu, *Development and Applications of a Compact Electron Cyclotron Resonance Source*, Rev. Sci. Instrum., 61(1), Jan. 1990, pp. 282–284.

Hoke, W.E.; Lemonias, P.J.; Weir, D.G., *Evaluation of a New Plasma Source for Molecular Beam Epitaxial Growth of InN and GaN Films*, Elsevier Science Publishers B.V. (North–Holland), 111, 1991, pp. 1024–1028.

Engelking, Paul C., *Spectroscopy of Jet–Cooled Ions and Radicals*, Chem. Rev., 91, 1991, pp. 399–414.

Ito, Satoshi; Ikeda, Masao; Akimoto, Katsuhiro, *Plasma Doping of Nitrogen in ZnSe Using Electron Cyclotron Resonance*, Jpn. J. Appl. Phys., 31, 1992, pp. 1316–1318.

Strite, S. and Morkoç, H., *GaN AlN, and InN: A Review*, J. Vac. Sci. Technol. B, 10(4), Jul./Aug. 1992, pp. 1237–1266.

Okuyama, Hirotuki; Kishita, Yuko; Miyajima, Takao; Ishibashi, Akira; Akimoto, Katsuhiro, *Epitaxial Growth of p–type ZnMgSSe*, Appl. Phys., 64(7), Feb. 1994, pp. 904–906.

Yoshida, Yoshikazu; Okazaki, Yasunao; Ito, Katsuyuki; Mizuguchi, Shin–Ichi, *Production of an Atomic Oxygen Beam by a Nozzle–Beam–Type Microwave Radical Source*, Rev. Sci. Instrum., 66(8), Aug. 1995, pp. 4166–4169.

Yoshida, Yoshikazu; Ito, Katsuyuki; Okazaki, Yasunao; Mitsuyu, Tsuneo, *Development and Application of a Nozzle–Beam–type Microwave Radical Source*, Rev. Sci. Instrum., 66(2), Feb. 1995, pp. 1015–1017.

BEAM SOURCE FOR PRODUCTION OF RADICALS AND METASTABLES

FIELD OF THE INVENTION

The present invention concerns methods and apparatus for producing beams of high potential-energy particles for depositing or modifying thin films on semiconductor substrates, and more particularly for producing intense beams of high potential energy radicals and metastables for the same.

BACKGROUND OF THE INVENTION

Various wide bandgap semiconductor materials provide a new class of electronic and optoelectronic devices capable of operating at substantially higher temperatures, powers, and frequencies than devices fabricated from existing, commercially available semiconductor materials. Semiconductor compounds classified as wide bandgap include, without limitation, silicon carbide, Group III-V nitride compounds, such as silicon nitride, aluminum nitride, gallium nitride, indium nitride, and alloys of the same.

Difficulties have been encountered in synthesizing the wide bandgap compounds in useable forms and quantities. For example, gallium nitride may be synthesized in useful quantities only at temperatures approaching 4500° C. and pressures of about $45 \times 10^6$ torr. It is only under such conditions that gallium metal reacts chemically with nitrogen to yield the wide bandgap semiconductor, gallium nitride. An alternative to synthesis under these conditions requires ultra-high vacuum, thin film deposition techniques wherein molecules of nitrogen are activated or forced into an excited state outside of a vacuum environment, formed into a high-energy particle beam and then co-deposited with metal vapor onto a semiconductor substrate inside a vacuum chamber. This approach has suffered from at least two major disadvantages. The thin film growth rates are slow and contamination of the high-energy particles and thus, of the thin film, is commonplace.

Another alternative thin film fabrication technique is chemical vapor deposition (CVD) wherein a non-volatile solid film is formed on a substrate by reaction of vapor phase chemicals that contain the required constituents. CVD methods for producing wide bandgap thin film semiconductor compounds typically rely on the reaction of ammonia gas with a group III metal containing compound, such as gallium chloride. A method related to CVD is metallorganic chemical vapor deposition (MOCVD). MOCVD utilizes plasma excited nitrogen or ammonia molecules in reaction with a trimethyl group III metal semiconductor compound to generate a desired nitrogen compound.

A significant disadvantage with both CVD and MOCVD is that the chemical reaction that generates the nitride is difficult to control and frequently produces contaminated thin films. Additionally, for both CVD and MOCVD methods, the substrate must be maintained at temperatures at or above 1000° C. for the reaction to take place. Such elevated temperatures are not suitable for depositing thin films on common semiconductor substrates that do not have the thermal stability to withstand such temperature levels, such as aluminum films.

Another alternative method for the production of wide bandgap semiconductor compounds is molecular beam epitaxy (MBE). MBE, utilizing ultra-high vacuum (UHV) techniques, is an evaporation process rather than a CVD process. In a MBE process silicon atoms and desired dopants are evaporated under UHV conditions (i.e., $10^{-11}$ torr). The evaporant atoms are directed to heated substrates, where they condense and grow epitaxially. A variant of MBE, reactive molecular beam epitaxy (RMBE), utilizes activated or excited nitrogen or ammonia gas to react with pure elemental group III metals to form nitride compound thin films. An advantage of RMBE is the ability of activated gases to facilitate the required reaction at lower substrate temperatures than possible with MBE techniques. Additionally, a much lower level of background gas contamination is present under UHV conditions.

Presently, a number of devices provide a source of high-energy particles (i.e., metastables and radicals) for the purpose of fabricating or modifying a thin-film substrate via RMBE. Such sources typically utilize a form of inductively-coupled or high-frequency discharge to activate or excite the particles, such as microwave or radio frequency techniques (RF). However, inductively-coupled, high-frequency discharge devices cannot provide high-energy particles in the absence of other discharge particles such as ions. Additionally, with such sources of high-energy particles the substrate has been placed such that it is exposed directly to the discharge environment, leading to contamination. An ideal high-energy particle generating source produces the desired particles in a discharge region that is physically isolated from the substrate and then transports the high-energy particles to the substrate during deposition or modification of the thin film.

Glow discharge systems have also been utilized to provide a source of high-energy particles. Unfortunately, in such systems a plasma is generated in the same vacuum chamber that contains the substrate to be modified. Accordingly the substrate is exposed directly to the discharge environment and, as a result, suffers damage due to contact with undesirable discharge particles such as ions.

Additionally, both microwave and RF are typically used to activate the gas prior to deposition. The exact nature of what occurs when the gas such as nitrogen is "activated" is not described herein, however, dissociation of $N_2$ into atomic N radical fragments is required. The dominant pathway for $N_2$ dissociation in a high-energy particle plasma leads to the formation of ground state atoms. Recombination of the atomic N radicals yields an excited $N_2$ molecule 10 eV above its ground state.

The primary relaxation pathway for the activated molecule is radiative via the Lewis-Rayleigh afterglow transition, $B^3\pi_g \rightarrow A^3\Sigma_u^+$, which is readily observed through an emission band at 582 nm. The emission at 582 nm indicates that the activation source is losing efficiency with respect to radical production. That is, due to recombination of the radicals, both microwave and RF sources do not provide highly concentrated beams of high-energy particles (radicals and metastables) at the deposition site. Lower high-energy particle concentrations reduce the rate of film growth and produce non-stoichiometric films.

To limit the degree of recombination of the high-energy particles, the plasma may be passed through an orifice, passing from a high pressure region to a low pressure region. If the high-energy particles are produced within a region of relatively high pressure and allowed to pass into a region of relatively low pressure, the frequency of collisions and therefore recombination is reduced. If the pressure difference between the high pressure and low pressure regions is sufficient, the high-energy particles in the plasma undergo supersonic expansion.

A system combining a microwave generated plasma and supersonic expansion has been developed. Although some recombination of the plasma particles was inhibited, the microwave discharge in the system was struck in the "expansion volume," a relatively large volume where the generated plasma is not constrained as to space. Accordingly, the high-energy particle plasma is substantially formed after gas expansion has occurred and the microwave power used to ignite the plasma must be distributed throughout a relatively large volume (i.e., the expansion volume). Thus, not all high-energy particles produced are entrained in the expanding plasma flow and excess energy is necessary to activate the particles.

Additionally, in microwave systems, the benefits of supersonic expansion (i.e., limiting recombination collisions of high-energy particles resulting in a higher concentration of high-energy particles) are lost when the plasma is generated in the expansion volume. That is, the process of dissociation of the gas particles (e.g., $N_2 \rightarrow N+N$) takes place in a large volume and transfers random kinetic energy to the particles therein. As a result, the high-energy particles generated race in all directions and collide with one another, leading to undesirable recombination. Further, a microwave system requires the plasma be generated at pressures below 760 torr. Moreover, microwave plasma systems are complex and expensive.

A system combining RF generated plasma and supersonic expansion has also been developed. Although some recombination of the plasma particles was inhibited, the discharge in the system was struck completely inside a nozzle and then passed through an orifice. Accordingly, the high-energy particles lost energy through collision and recombination prior to passing through the orifice and supersonically expanding. Thus, the concentration of high-energy particles within the plasma directed toward the semiconductor substrate was low, slowing the fabrication or modification rate. Further, in RF discharge systems the "discharge chamber" (i.e., nozzle) becomes heated during operation, requiring cooling, such as with water. Moreover, like microwave systems, an RF system is both complex and expensive.

Accordingly, it is an object of the invention to provide a system and method for synthesizing high-purity, wide bandgap semiconductor compounds, such as group III-V metal nitride compounds.

It is also an object of the invention to provide a system and method for producing high-energy particle plasma beams for the purpose of depositing and/or modifying thin films, and for high resolution lithography of semiconductors.

It is also an object of the invention to provide a system and method for producing high-energy particle plasma beams to enhance doping of semiconductor substrates and thin films thereon.

It is also an object of the present invention to provide a system and method for synthesizing high-purity, group III-V metal nitride compound thin films at lower temperatures than conventional methods.

It is also an object of the present invention to provide a system and method for synthesizing high-purity, wide bandgap semiconductor compounds for deposition or modification of thin films, while requiring a relatively low power consumption and utilizing a relatively inexpensive power source.

It is another object of the invention to provide a plasma source and method for producing high density, high-energy particle (e.g., radicals and metastables) plasma beams.

It is another object of the invention to provide a plasma source and method that limit recombination and collision of high-energy particles in the plasma beam.

Also, it is an object of the invention to provide a plasma source and method for producing a high density, high-energy particle plasma in an environment at or near ambient pressure.

It is another object of the invention to provide a plasma source and method that produce a high-energy particle plasma in a pre-expansion volume.

It is another object of the invention to provide a plasma source and method for producing a high-energy particle plasma constrained within an insulating nozzle wherein all the high-energy particles then pass into an expansive vacuum environment.

It is also an object of the invention to provide a system for synthesizing high-purity, wide bandgap semiconductor compounds.

It is another object of the invention to provide a corona discharge system and method for synthesizing high-purity, wide bandgap semiconductor compounds in a deposition chamber while substantially precluding positive ions from entering the deposition chamber.

It is also an object of the invention to provide a corona discharge system and method for synthesizing high-purity, wide bandgap semiconductor thin films while precluding contamination of the thin films.

It is also an object of the invention to provide a corona discharge system and method for fabricating wide bandgap semiconductor thin films in a simple and economic manner.

SUMMARY OF THE INVENTION

The foregoing objects are achieved by providing methods and apparatus for making semiconductors by depositing or modifying thin films on semiconductor substrates by way of producing a corona discharge plasma comprising an intense beam of high-energy particles, supersonically expanding the plasma, and defining and directing the plasma toward a semiconductor substrate.

In an embodiment of the present invention, a corona discharge plasma (i.e., beam of high-energy particles) is created for depositing and/or modifying a thin film on a semiconductor substrate utilizing a discharge system including a corona discharge nozzle, a source body, a molecular beam skimmer, and a thin film vacuum deposition chamber.

The corona discharge nozzle includes an electrically insulated nozzle tube (i.e., a tube comprised of a material having a relatively high electrical resistivity), the nozzle tube having a first end connected to a gas source, and a second end forming a nozzle orifice. An electrode is axially disposed within the nozzle tube and is connected at a first end to a power source. A second end of the electrode is positioned adjacent the nozzle orifice.

The corona discharge nozzle is contained within a source body. The interior of the source body is maintained below atmospheric pressure when the system is in operation. A molecular beam skimmer, connected to the source body, is axially aligned with the nozzle orifice and a semiconductor substrate. A substantial portion of the corona discharge nozzle and source body, and the entire molecular beam skimmer, and semiconductor substrate are enclosed within a high-vacuum thin film deposition chamber.

To deposit or modify a thin film on a semiconductor substrate, a high-purity gas to be activated is supplied to the corona discharge nozzle at a relatively high pressure in comparison to the pressure of the source body. Direct-current voltage is supplied to the electrode to generate a corona discharge within the nozzle orifice. That is, the discharge makes electrical contact to ground through the nozzle orifice. Energy from the discharge is transferred to the gas atoms and/or molecules creating a corona discharge plasma of high-energy particles. As the plasma exits the nozzle orifice, the plasma is supersonically expanded in the source body by maintaining the source body at a relatively low pressure. The molecular beam skimmer defines and directs the plasma toward the semiconductor substrate.

Accordingly, the apparatus and method of the present invention provides a highly concentrated beam of high-energy particles whose loss of energy through collision and recombination is significantly reduced. Highly concentrated, high-energy particle beams increase the rate of deposition or modification of the thin films.

Further, since the corona discharge makes electrical contact to ground through the nozzle orifice in the apparatus and method of the present invention, all the power necessary to generate the discharge is efficiently transferred to the gas particles. Accordingly the apparatus and method of the present invention utilize significantly less power than previously known systems.

Moreover, the apparatus and methods of the present invention operate at or near ambient temperature. Thus, semiconductor substrates lacking the thermal stability to withstand the elevated temperatures of conventional methods are not detrimentally affected by the method of the present invention. Additionally, the apparatus and method of the present invention utilize an inexpensive power source (relative to RF and Microwave systems), consuming power at a significantly lower level, reducing the cost of the system. The corona discharge system of the present invention is also simple in structure.

DETAILED DESCRIPTION OF THE PREFERRED EMBODIMENTS

Figure 1:
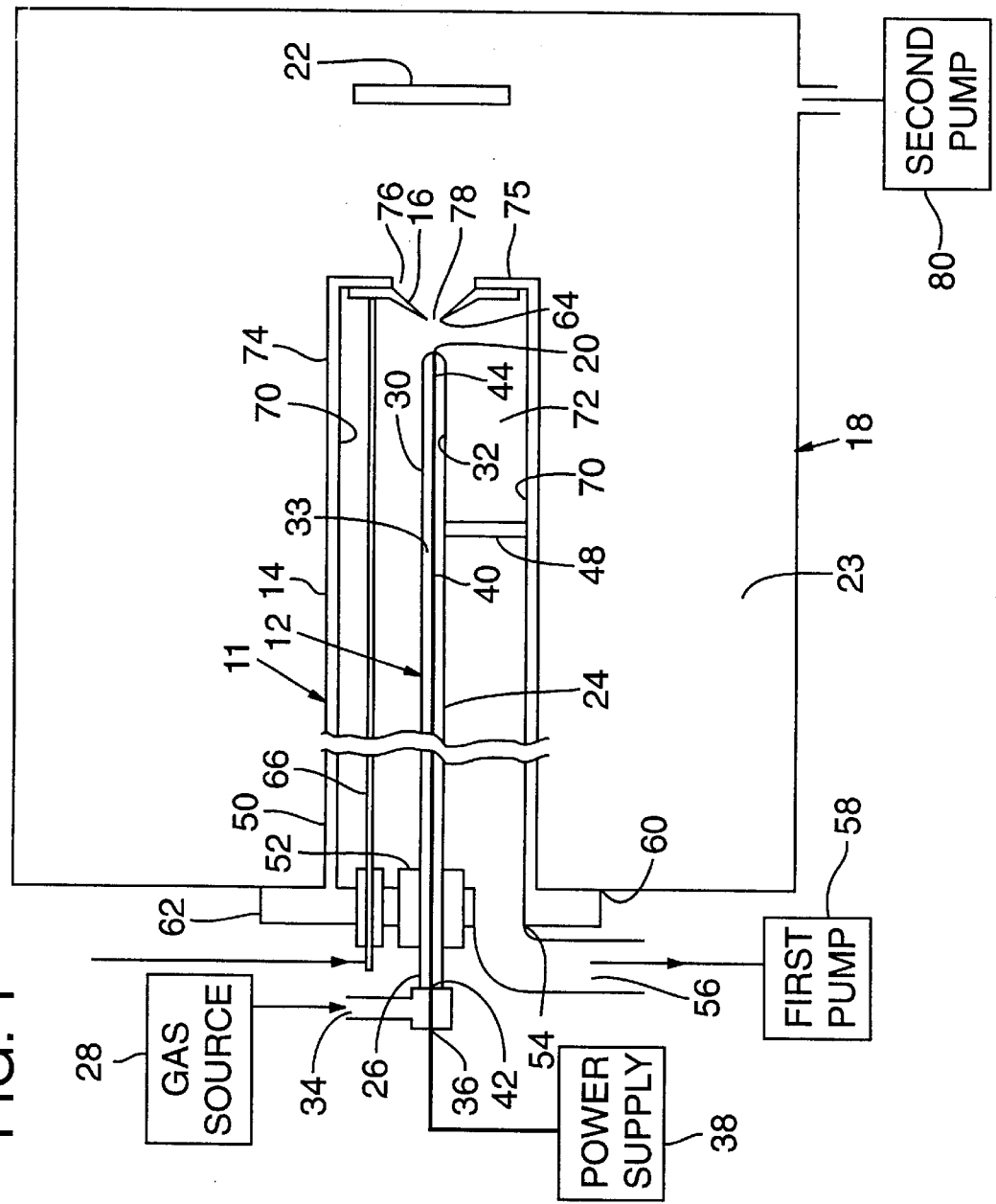
FIG. 1 is a schematic, elevational, cross-sectional view of a corona discharge system of the present invention.

FIG. 1 shows a thin-film vacuum deposition system 10 according to the present invention. In the embodiment in FIG. 1, a corona discharge plasma containing a high density of radicals and metastables is created utilizing a corona discharge system 11 having a corona discharge nozzle 12, a source body 14, and a molecular beam skimmer 16. The corona discharge nozzle 12, having a nozzle orifice 20, is contained within the source body 14. The molecular beam skimmer 16, connected to the source body 14, defines a skimmer orifice 78 which is axially aligned with nozzle orifice 20 and a substrate 22. A portion of the corona discharge system 11 which also contains substrate 22 is contained within a chamber 23 defined by a thin-film vacuum deposition vessel 18.

The corona discharge nozzle 12 includes an electrically insulated nozzle tube 24 having a first end 26 connected to a high-purity gas source 28. The nozzle orifice 20 is formed in a second end 30 of the nozzle tube 24.

The nozzle tube 24 is fabricated from an electrically insulating material such as ceramic or glass. Fabricating the nozzle tube 24 from an insulating material inhibits intimate contact between a corona discharge spark (discussed below) and an interior surface 32 of the nozzle tube 24. Accordingly, the nozzle tube does not obtain high temperatures during operation such that cooling is necessary (as is required in RF systems).

The nozzle tube 24 is substantially cylindrical in shape, with an outside diameter of about 6 mm and defines a passageway 33 extending the length of the nozzle tube. Other shapes and sizes are suitable as long as the interior surface 32 of the nozzle tube 24 presents a continuous surface and the tube is fabricated of electrically insulating material.

The nozzle tube 24 defines a gas inlet 34 and a power source inlet 36 but is otherwise closed at the first end 26. Inert fittings, such as nylon or Teflon T-fittings (not shown), preferably are provided at the gas inlet 34 to connect the nozzle tube 24 with the high-purity reactant gas source 28. It is important that both the nozzle tube 24 and fittings are fabricated of materials that will not contribute contaminants to the reactant gas to be activated during operation of the system.

At the second end 30, the interior surface 32 tapers down to the narrow nozzle orifice 20. Good results are achieved with a nozzle orifice diameter of from about 50 $\mu$m to about 200 $\mu$m. The diameter of the nozzle orifice 20 is, in part, dictated by the dimensions of the nozzle tube 24, source body 14 and an electrode 40 located inside the nozzle tube 24. Good results have been achieved with a nozzle tube outer diameter of 6 mm and a nozzle orifice diameter of 200 $\mu$m, however, other dimensions may provide satisfactory results. A smaller nozzle orifice reduces pump requirements for maintaining a vacuum environment within the source body 14.

The electrode 40 is axially disposed within the nozzle tube 24 extending from the first end 26 to the second end 30 of the nozzle tube 24. The electrode 40, having a first end 42 positioned adjacent the power source inlet 36, extends along a horizontal axis A, through the nozzle tube 24 terminating at a second end 44 positioned inside the nozzle tube 24 at a distance equal to about one to about five nozzle orifice diameters from the nozzle orifice 20 (as measured from the innermost portion of the nozzle orifice immediately adjacent the interior of the nozzle tube).

Figure 2:
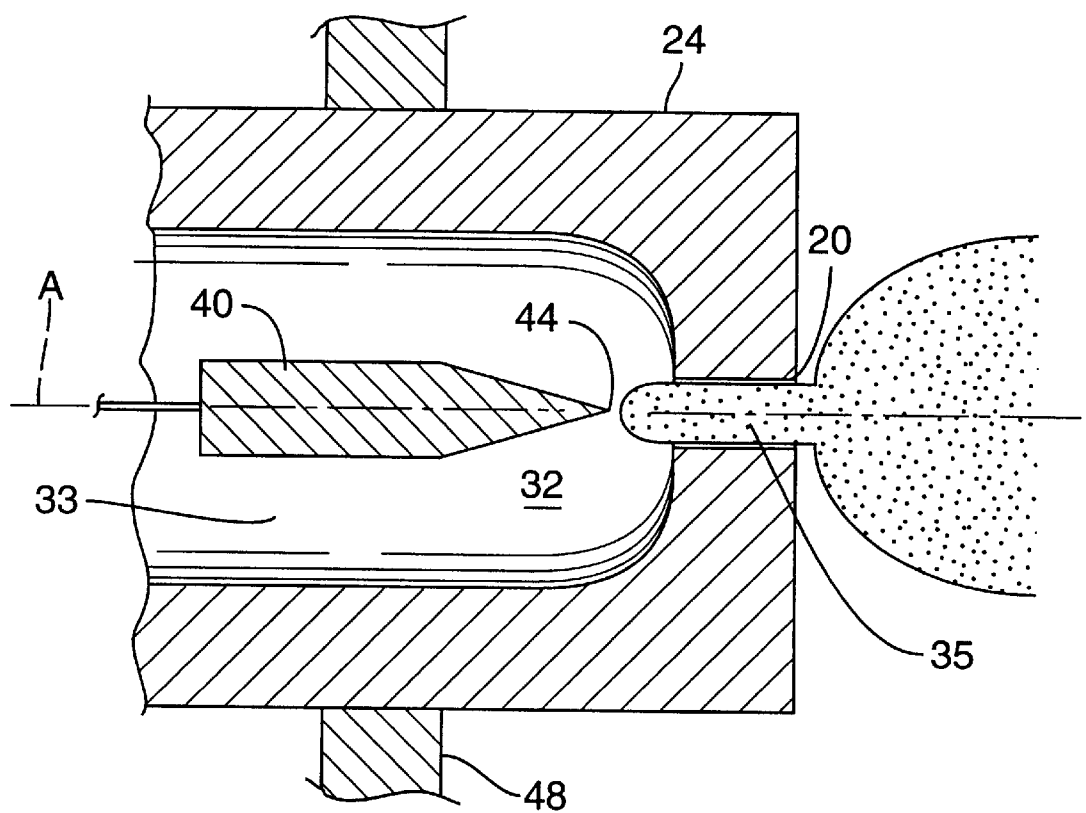
FIG. 2 is an enlarged, cut-away, cross-sectional view of a plasma generated immediately adjacent to and inside a nozzle orifice of a corona discharge system of the present invention.

By positioning the second end 44 of the electrode 40 close to the nozzle orifice 20, recombination of generated high-energy particles in the passageway 33 of the corona discharge nozzle tube 24 is minimized as the plasma 35 is generated immediately adjacent to and within the nozzle orifice (FIG. 2). Additionally, interaction of the corona discharge spark that emanates from the second end 44 of the electrode 40 with the interior surface 32 of the nozzle tube 24 is minimized, also reducing chance of recombination or collision of the high-energy particles. For the same reasons, the electrode 40 should be aligned such that it does not have intimate contact with the interior surface 32 of the nozzle tube 24.

In general, the shape of the electrode 40 is not critical. In one embodiment of the present invention, the electrode 40 is of narrow and uniform diameter from the first end 42 to the second end 44 with the exception of the tip of the electrode at the second end which is tapered to a fine point, as shown in FIG. 2. In an alternative embodiment (not shown), the electrode is of a larger diameter at the first end, tapering continuously from the first end to a fine point at the second end. A larger electrode diameter at the first end relative to the second end, aids in establishing and maintaining proper alignment of the electrode within the nozzle tube. A larger diameter at the first end of the electrode relative to the diameter of the second end is particularly beneficial when the electrode comprises a wire-type material that bends easily.

The fine point or tip at the second end 44 of the electrode 40 should be sharp enough to facilitate a corona discharge. Good results are achieved when the diameter of the electrode at the tip (i.e., the fine point) is about 200 μm or smaller.

To control where the corona discharge is created there must be only one "point" on the electrode 40 as sharp points cause a corona discharge to take place. Thus, the electrode 40 has a smooth outer surface from the first end 42 to the second end 44. As discussed below, in the present invention the corona discharge takes place immediately adjacent to and inside the nozzle orifice 20 to maximize the density of high-energy particles in the corona discharge plasma 35.

Generally, the composition of the electrode 40 is not critical. The electrode 40 may be formed from tungsten, stainless steel, or any other metal capable of being processed to a fine point and possessing a relatively high melting point (i.e., preferably a melting point greater than 1800° C.). Put another way, the electrode is preferably not made of a soft metal. Good results are achieved when the electrode 40 is an anode, which limits the potential problem of sputter contamination. Sputtered material can contaminate the thin film to be fabricated or modified. If the electrode is a cathode, positive ions from the corona discharge are attracted to the electrode, impacting the electrode with their high velocity. Impaction of the electrode by the positive ions (i.e., particles possessing large amounts of kinetic energy) forces material off of the electrode. Such material then enters the plasma beam and ultimately contaminates the thin film.

The electrode 40 is connected at the first end 42 to a direct-current (DC), remote power source 38. The power source 38 supplies a sufficiently high, direct-current voltage to the electrode 40 that a corona discharge is achieved. A DC current power source is preferred over an AC power source for several reasons. An AC power source is significantly more expensive than a DC power source and an AC power source requires a more complex corona discharge apparatus and method. Moreover, AC current power supplies are much bigger than DC power sources, requiring more room in what are often areas of limited space.

A DC power source 38 capable of supplying up to about 20,000 volts of a positive polarity to the electrode 40 and capable of supporting up to 5 mA of discharge current is suitable (available from EMCO High Voltage of Sutter Creek, Calif.). A power source 38 capable of supplying up to about 30,000 volts of a positive polarity to the electrode 40 is not excessive. Providing a positive polarity to the electrode 40 causes cations to be repelled therefrom during discharge. Accordingly, sputter damage to the electrode 40 is avoided, and contamination of the plasma beam with sputtered material from the electrode 40 is also inhibited.

A ballast resistance (not shown) may be provided to limit the total current. The power source 38 is ballasted with about 1 to about 10M ohms of resistance in series with the electrode 40.

The corona discharge nozzle 12 is contained within a chamber 72 defined within the source body 14. To support and maintain alignment of the discharge nozzle within the source body 14, one or more supports 48 extend from one or more interior surfaces 70 of the source body 14 to the discharge nozzle 12. A first end 50 of the source body 14 includes a first opening 52 for receiving the discharge nozzle 12 in a manner such that the gas source 28 and power source 38 can be connected to the first end of the discharge nozzle 12 and electrode 40, respectively. A second opening 54 is defined in the first end 50 of the source body 14 for connecting the chamber 72 to a remote first pump 58 via a conduit 56.

The first pump 58 preferably comprises a high capacity mechanical pump (e.g., able to pump about 5 to about 50 L/s or greater). The pump is of suitable capacity to maintain the chamber 72 of the source body 14 at a pressure of about 0.5 torr, or a pressure low enough to attain a supersonic expansion of the plasma 35 exiting the discharge nozzle orifice 20. The necessary pressure difference between the source body 14 and nozzle orifice 20 is discussed below.

The shape of the source body 14 is not critical. The source body 14 illustrated in FIG. 1 is cylindrical in shape and encloses a substantial portion of the discharge nozzle 12. The source body 14 is fabricated of a material capable of withstanding high vacuum environments (e.g., about 0.5 torr) and, preferably, is fabricated of a material that will not outgas in a manner that disturbs the vacuum pressure level within the deposition chamber. The source body 14 is preferably of dimensions that conform to existing thin-film fabrication equipment. Accordingly, in one embodiment of the invention, the source body 14 is cylindrical in shape, having an outside diameter such that the source body 14 fits in a standard 70 mm conflate high vacuum, thin-film deposition chamber port 60, such as an MBE chamber port. The source body 14 has flanges 62 for bolting to the deposition vessel 18.

At the second end 74 of the source body 14 is an end wall 75 which defines an opening 76. The molecular beam skimmer 16, which is mounted on the end wall 75, is of standard dimensions (i.e., 1 cm height, 1 mm circular orifice, 50° internal angle and 55° external angle, measured relative to the horizontal axis A). With a rod-shaped electrode 40, as discussed above, excellent results are achieved utilizing the illustrated cone-shaped molecular beam skimmer 16. The tip or apex 64 of the skimmer is positioned within the source body 14 and defines a skimmer orifice 78 that is axially aligned with the nozzle orifice 20. High-energy particles of the corona discharge plasma pass through the skimmer orifice 78.

The skimmer orifice 78 forms the interface between the moderate pressure source body chamber 72 and the high vacuum thin film deposition chamber 23 and serves to define and direct the plasma beam. It has been found that the cone-shaped molecular beam skimmer 16 is especially effective when the skimmer comprises an angle of about 50° to about 55°, measured relative to the horizontal axis A. Such angle is useful to suitably penetrate the plasma discharge to form a molecular beam while avoiding disturbing the supersonic expansion of the plasma that takes place outside the nozzle orifice 20.

In alternative embodiments, the molecular beam skimmer orifice 78 may be of a different configuration, such as a slit, as long as the accompanying electrode 40 is of complimentary shape and dimensions.

The molecular beam skimmer 16 is mounted to the source body 14 in a manner such that the skimmer orifice 78 is axially aligned with the nozzle orifice 20 and with the substrate 22 in the thin-film deposition chamber 23. The molecular beam skimmer 16 is mounted to the source body 14 in a manner such that the skimmer is electrically insulated from the source body 14 so that a voltage may be applied to the skimmer.

The molecular beam skimmer 16 is provided with the capacity to carry up to 500 V in either polarity. Biasing the skimmer with a positive voltage substantially precludes contamination of the beam entering the deposition chamber 18. Specifically, positive ions are repelled from the biased skimmer so that the ions do not enter the plasma beam and contaminate the thin film. The molecular beam skimmer 16 is biased with a standard electrical feedthrough 66 extending through the source body 14. An additional set of deflection optics may be added to the system to further preclude positive ions from entering the plasma beam.

The chamber 23 of the thin-film vacuum deposition chamber is maintained at a sufficiently low pressure by second pump 80. The above-described high pressure, positive point corona discharge nozzle 12 and supersonic expansion apparatus provide for superior thin film fabrication and modification capabilities at reduced cost and complexity through the production of intense, collimated plasma beams of high-energy particles.

The high-energy particles in the corona discharge plasma consist of electronically excited neutral atoms and molecules as well as ions of the same. In general, the corona discharge plasma contains metastable and radical high-energy particles. A metastable, as defined herein, is an atom or molecule existing in an excited electronic state that does not have a dipole allowed transition to a lower energy state. That is, the atom or molecule is "trapped" in the excited state for periods of microseconds to milliseconds before releasing their potential energy and returning to the ground state electronic configuration. Energy release can occur through collisional energy transfer to another atom or molecule, or may occur through internal electronic reconfiguration followed by emission of a photon or photons. A radical, as defined herein, is an atom or molecule possessing an unpaired electron in an atomic or molecular electronic orbital. Energy release from the radical occurs upon collision with a reactive particle.

A supersonic corona discharge nozzle of the present invention greatly reduces the frequency of such collisions and recombinations. Any loss of energy through subsequent collision or recombination is quenched by the supersonic expansion of the corona discharge plasma. Additionally, the present invention supersonic corona discharge nozzle distributes energy to and activates only those gas particles that are supersonically expanded immediately following their production in the discharge nozzle orifice. Production of the plasma inside the nozzle orifice results in enhancement of the current density applied to the gas. That is, only approximately 0.1 W of power is required to generate $10^{16}$ metastable particles per $cm^3$ in a discharge nozzle orifice 20 having a diameter of about 100 μm, as compared to the 1000 W of power necessary to achieve comparable metastable densities in an RF or microwave system.

According to a method of the present invention, a high purity reactant gas is supplied from the gas source 28 to the discharge nozzle 12 at a rate such that the pressure inside the nozzle is about 380 torr to about 7,600 torr, and preferably between about 760 torr and 3,800 torr. The reactant gas source may supply an electro-negative or an electro-positive reactant gas. An electro-positive, high-purity reactant gas provides excellent results because it does not tend to produce negative ions. Negative ions are attracted to the positive point corona (i.e., the anode) causing sputter damage as described above. The reactant gas to be supplied is dependent upon the thin film to be fabricated or modified. High purity gases suitable for use with the present invention include, but are not limited to, nitrogen, helium, hydrogen, oxygen, chlorine, carbon tetrafluoride, and mixtures thereof. The gas is supplied at a rate of about 1 liter per second.

As reactant gas is supplied to the discharge nozzle 12 a positive polarity, DC high voltage simultaneously is supplied to the electrode 40. Good results have been achieved when about 10 kV to about 20 kV is supplied to the electrode to initiate the corona discharge.

The chamber 72 of the source body 14 is maintained at a pressure of about 0.1 torr to about 1 torr via activation of the first pump 58. The pressure at which the chamber 72 should be maintained is dependent upon the pressure inside the nozzle 24 and the discharge nozzle orifice 20. For an effective supersonic expansion following production of the corona discharge plasma, the difference in pressure between the discharge nozzle orifice 20 and the chamber 72 is preferably in the order of at least about $10^2$ to about $10^5$, with good results achieved with a pressure difference in the order of about $10^3$ to about $10^4$. Excellent results have been achieved when the pressure difference is in the order of about $10^3$. Accordingly, if the pressure in the chamber 72 is maintained at 500 mTorr, the pressure within the interior 32 of the discharge nozzle 12 and in the nozzle orifice 20 is preferably about 1000 Torr.

As gas is supplied to the discharge nozzle 12 and a potential is applied to the electrode 40, a corona discharge occurs. The discharge forms a continuous spark which extends from the tip at the second end 44 of the electrode 40 to a location within the nozzle orifice 20. Atoms and/or molecules passing through the nozzle orifice 20 experience temperatures of about 10,000° C. in the spark. The current density within the spark channel is in the order of about $10^4$ $A/cm^2$. Energy from the corona discharge is deposited into the gas atoms and/or molecules, forming a plasma. Since the potential applied to the electrode 40 is positive, the current within the spark adjacent to the electrode comprises substantially, exclusively electrons. Electrons, attracted to the electrode, do not cause sputter damage due to their relatively small size and weight (and, therefore, much smaller momentum) in comparison to positive particles. Such conditions produce a plasma containing high-energy radical and metastable particles at a concentration of about $10^{16}$ to about $10^{20}$ particles/$cm^3$ inside the nozzle orifice 20.

Following production of the corona discharge plasma, the high-energy particles in the plasma undergo supersonic expansion as they enter the vacuum environment of the source body chamber 72. The supersonically expanding plasma beam is penetrated by the tip of the cone-shaped molecular beam skimmer 16. As discussed above, the skimmer orifice represents the interface between the source body 14 and the high vacuum thin film the deposition chamber 18.

The molecular beam skimmer 16 defines and directs the plasma beam in a direction toward the semiconductor substrate 22 to fabricate or modify a thin film thereon. The excited particles of the plasma are then co-deposited with metal vapor onto or into the substrate.

In an embodiment of the present invention, a positive voltage is applied to the molecular beam skimmer 16 as the plasma passes therethrough to preclude ionic contamination of the corona discharge plasma beam that enters the deposition chamber. Pump 80 maintains the pressure within deposition chamber 23 at about $10^{-6}$ to about $10^{-10}$ torr, or the appropriate pressure for the deposition or modification of a particular thin film, as is known to those persons skilled in the art. The background pressure of the deposition chamber 23 preferably does not exceed $10^{-10}$ torr.

Although the system and methods of the present invention are generally discussed in terms of thin film deposition or modification of wide bandgap semiconductor compounds, the system and methods are equally applicable to a number of semiconductor compounds and for various semiconductor modification techniques. The present invention can be utilized to enhance both P and N-type doping of existing semiconductor thin film substrates, provide enhanced cleaning and preparation of semiconductor substrates, and produce the necessary beams of high-energy particles for the purpose of high resolution lithography.

The present invention has been described in connection with preferred embodiments. It will be understood that the invention is not limited to those embodiments, but covers all alternatives, modifications, and equivalents as may be included within the spirit and scope of the invention as defined by the following claims.

I claim:

1. A method of making a semiconductor, the method comprising the steps of:

generating a corona discharge plasma primarily comprising high-energy particles;

supersonically expanding the plasma as the plasma exits a nozzle; and passing the expanded plasma through a molecular beam skimmer and onto a substrate.

2. The method of claim 1 wherein the corona discharge plasma is generated immediately adjacent to and inside a nozzle orifice defined by the nozzle.

3. The method of claim 2 wherein the step of generating the corona discharge plasma further includes the step of maintaining a pressure within the nozzle and nozzle orifice in the range of about 380 torr to about 7600 torr.

4. The method of claim 2 wherein the step of generating the plasma further includes the step of maintaining a pressure from about 760 torr to about 3800 torr within the nozzle and the nozzle orifice.

5. The method of claim 4 wherein the step of generating the corona discharge plasma further includes the step of supplying a positive potential, direct-current voltage to an electrode positioned within the nozzle such that the electrode is an anode.

6. The method of claim 5 wherein the step of generating the corona discharge plasma further includes the steps of:

providing the electrode with one end of the electrode positioned adjacent the nozzle orifice;

supplying a reactant gas to the nozzle; and decomposing the reactant gas to generate the corona discharge plasma in the nozzle orifice.

7. The method of claim 1 wherein the step of supersonically expanding the plasma further includes the steps of:

providing a source body surrounding the nozzle orifice; and maintaining a pressure of about 0.1 torr to about 1 torr inside the source body.

8. The method of claim 1 wherein the step of passing the plasma through a molecular beam skimmer further includes the steps of:

providing a source body surrounding the nozzle orifice;

electrically insulating the molecular beam skimmer from the source body; and biasing the molecular beam skimmer with a positive voltage.

9. A method of making a semiconductor, the method comprising the steps of:

generating a corona discharge plasma in a first region, the first region being located in the orifice of a nozzle;

supersonically expanding the corona discharge plasma generated in the first region into a second region located outside of the orifice;

maintaining a pressure difference of from about $10^2$ torr to about $10^5$ torr between the first region and the second region to facilitate the expanding; and penetrating the supersonically expanding corona discharge plasma with a molecular beam skimmer to collimate and direct at least a portion of the plasma toward a substrate.

10. The method of claim 9 wherein the step of maintaining the pressure difference between the first region and the second region further includes the step of maintaining a pressure difference of from about $10^3$ torr to about $10^4$ torr.

11. The method of claim 9 wherein the step of generating the corona discharge plasma further includes the steps of:

providing an electrode axially aligned with the orifice of the nozzle, the electrode extending within the nozzle; and supplying a direct-current voltage to the electrode.

12. A method of making a semiconductor, the method comprising the steps of:

providing a nozzle tube which defines a nozzle orifice at an end of the nozzle tube, the nozzle tube containing an electrode having a tip located adjacent the nozzle orifice;

generating a corona discharge in the nozzle tube such that a continuous spark extends from the tip of the electrode, into the nozzle orifice;

generating a plasma from the corona discharge, the plasma being generated within the nozzle orifice;

supersonically expanding the plasma as the plasma exits the nozzle orifice; and passing at least a portion of the supersonically expanding plasma through a molecular beam skimmer toward a substrate.

13. The method of claim 12 wherein the step of generating the corona discharge within the nozzle orifice further includes the step of generating a current density of about $10^4$ A/cm$^2$ in the spark.

14. The method of claim 13 wherein the step of generating a corona discharge, further includes the steps of:

supplying positive potential, direct-current voltage to the electrode;

supplying a reactant gas into the nozzle tube through an opening other than the nozzle orifice; and decomposing the gas to generate the corona discharge plasma.

15. A system for making a semiconductor, the system comprising:

a corona discharge nozzle which defines a passageway, a reactant gas inlet, and a nozzle orifice;

an electrode disposed within and axially aligned with the passageway and connected to a power source, the electrode being positioned such a distance from the nozzle orifice that, when power is supplied to the electrode and a reactant gas is supplied through the gas inlet, a corona discharge takes place within the nozzle orifice;

a source body which surrounds the nozzle and defines a chamber containing the nozzle; and a molecular beam skimmer axially aligned with the nozzle orifice for collimating at least a portion of a corona discharge plasma exiting the nozzle orifice toward a substrate.

16. The system of claim 15 including a pump connected to the source body for maintaining a vacuum environment in the chamber.

17. The system of claim 15 wherein the corona discharge nozzle, source body and molecular beam skimmer open into a thin-film vacuum deposition chamber.

18. The system of claim 15 wherein the nozzle orifice is circular and an end of the electrode terminates at a distance from the nozzle orifice of from about one times to about five times the diameter of the nozzle orifice.

19. A corona discharge system for fabricating a semiconductor device, the system comprising:

a corona discharge tube defining a first region which is a nozzle orifice of the corona discharge tube;

a source of reactant gas, the source being connected to the corona discharge tube;

an electrode disposed within the corona discharge tube and connected to a direct-current power source, the electrode being positioned such a distance from the nozzle orifice that, when power is supplied to the electrode and a reactant gas is supplied to the corona discharge tube, a corona discharge takes place within the orifice;

a source body defining a second region immediately adjacent to and in fluid communication with the first region, the second region being at a pressure sufficiently lower than the first region such that a corona discharge plasma generated in the first region supersonically expands into the second region;

a molecular beam skimmer having an orifice which is axially aligned with the first region, the molecular beam skimmer being located adjacent to the second region, and intermediate the second region and a third region defined by a thin-film deposition chamber; and a substrate support located in the third region in axial alignment with the molecular beam skimmer orifice.

20. The system of claim 19 wherein the first region further comprises a nozzle orifice defined by an end of the corona discharge tube, the nozzle orifice having a diameter and being positioned at a distance of about one to about five nozzle orifice diameters from a tip of the electrode.

* * * * *